(12) United States Patent
Huang et al.

(10) Patent No.: US 11,075,159 B2
(45) Date of Patent: Jul. 27, 2021

(54) INTEGRATED FAN-OUT PACKAGES AND METHODS OF FORMING THE SAME

(71) Applicant: Taiwan Semiconductor Manufacturing Co., Ltd., Hsinchu (TW)

(72) Inventors: Ching-Yu Huang, Hsinchu (TW); Han-Ping Pu, Taichung (TW); Ming-Kai Liu, Hsinchu (TW); Ting-Chu Ko, Hsinchu (TW); Yung-Ping Chiang, Hsinchu County (TW); Chang-Wen Huang, Hsinchu (TW); Yu-Sheng Hsieh, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/035,723

(22) Filed: Jul. 16, 2018

(65) Prior Publication Data
US 2020/0020628 A1    Jan. 16, 2020

(51) Int. Cl.
| | | |
|---|---|---|
| H01L 23/00 | (2006.01) | |
| H01L 23/522 | (2006.01) | |
| H01L 21/56 | (2006.01) | |
| H01L 23/31 | (2006.01) | |
| H01L 23/538 | (2006.01) | |
| H01L 23/532 | (2006.01) | |
| H01L 21/768 | (2006.01) | |

(52) U.S. Cl.
CPC .......... *H01L 23/5226* (2013.01); *H01L 21/56* (2013.01); *H01L 21/76873* (2013.01); *H01L 23/3157* (2013.01); *H01L 23/5381* (2013.01); *H01L 23/5383* (2013.01); *H01L 23/53238* (2013.01); *H01L 24/09* (2013.01); *H01L 24/14* (2013.01); *H01L 2224/02379* (2013.01); *H01L 2224/0401* (2013.01)

(58) Field of Classification Search
None
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |

(Continued)

OTHER PUBLICATIONS

"Side by side", Oxford English Dictionary Online, Mar. 2019, https://oed.com/view/Entry/34821169?redirectedFrom=side+by+side#eid, Accessed Nov. 12, 2019. (Year: 2019).*

*Primary Examiner* — Reema Patel
(74) *Attorney, Agent, or Firm* — JCIPRNET

(57) ABSTRACT

Integrated fan-out packages and methods of forming the same are disclosed. An integrated fan-out package includes two dies, an encapsulant, a first metal line and a plurality of dummy vias. The encapsulant is disposed between the two dies. The first metal line is disposed over the two dies and the encapsulant, and electrically connected to the two dies. The plurality of dummy vias is disposed over the encapsulant and aside the first metal line.

20 Claims, 22 Drawing Sheets

(56) References Cited

U.S. PATENT DOCUMENTS

| | | |
|---|---|---|
| 9,368,460 B2 | 6/2016 | Yu et al. |
| 9,372,206 B2 | 6/2016 | Wu et al. |
| 9,496,189 B2 * | 11/2016 | Yu .......................... H01L 22/32 |
| 9,543,249 B1 * | 1/2017 | Hu ....................... H01L 23/5384 |
| 2005/0078057 A1 * | 4/2005 | Chang ................. G02F 1/13454 |
| | | 345/55 |
| 2011/0068481 A1 * | 3/2011 | Park ................... H01L 23/3128 |
| | | 257/777 |
| 2017/0141053 A1 * | 5/2017 | Chen ................... H01L 23/3114 |

* cited by examiner

INTEGRATED FAN-OUT PACKAGES AND METHODS OF FORMING THE SAME

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. In order to connect the various electronic components, the dimension of the redistribution layer (RDL) becomes smaller and smaller. The high density RDL has the advantage of small dimension for the complex electrical route. However, there are many challenges related to the high density RDL in the integrated fan-out packages.

DETAILED DESCRIPTION

Figure 1:
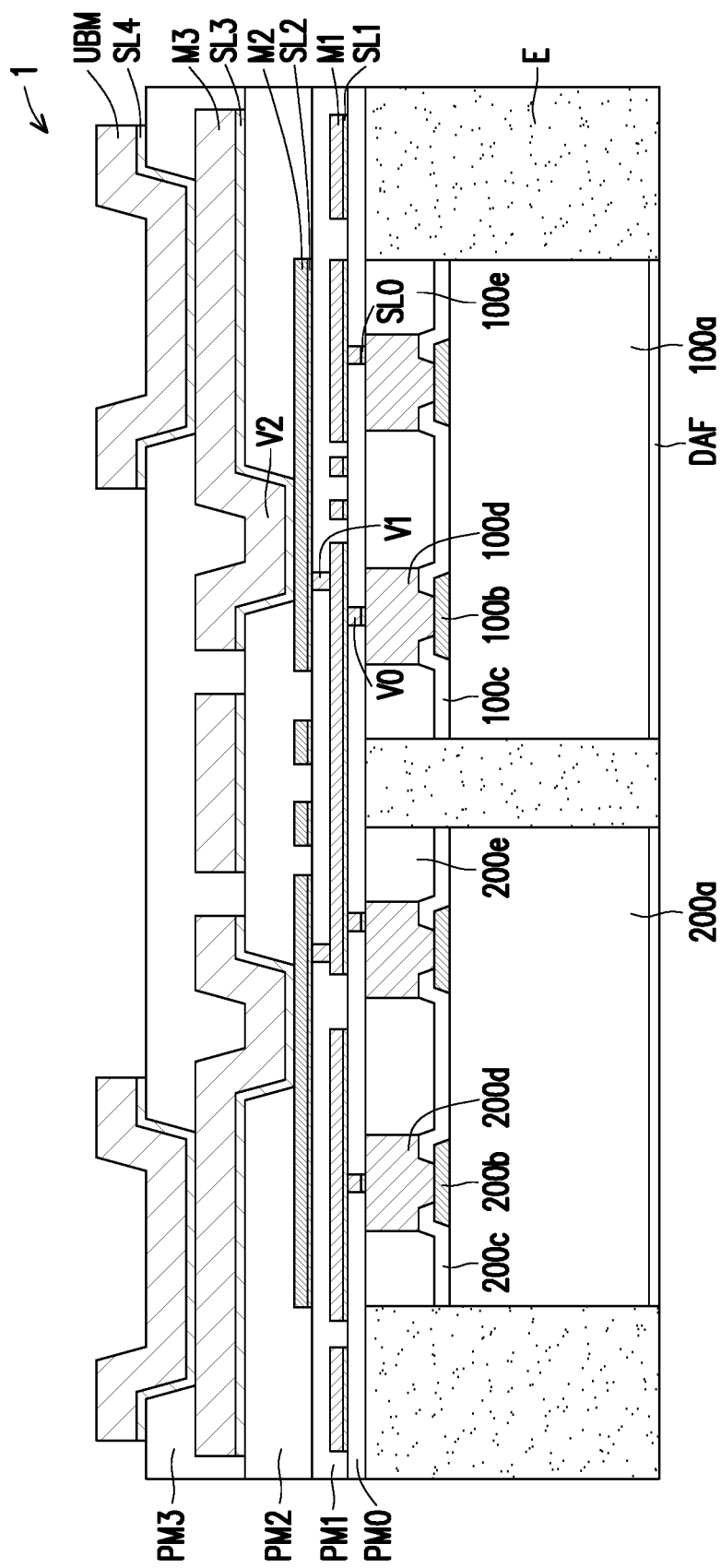
FIG. 1 is a cross-section view of an integrated fan-out package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2A:
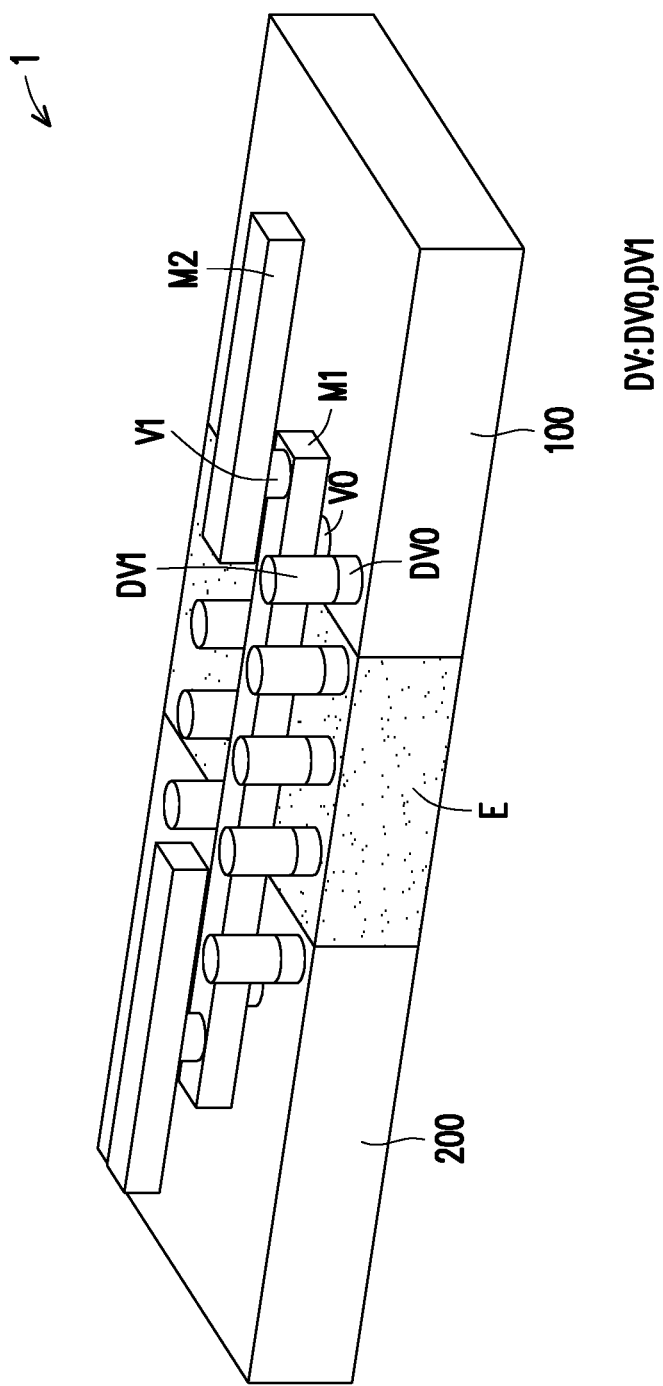
FIG. 2A is a simplified three-dimensional illustration of an integrated fan-out package in accordance with some embodiments.
Figure 2B:
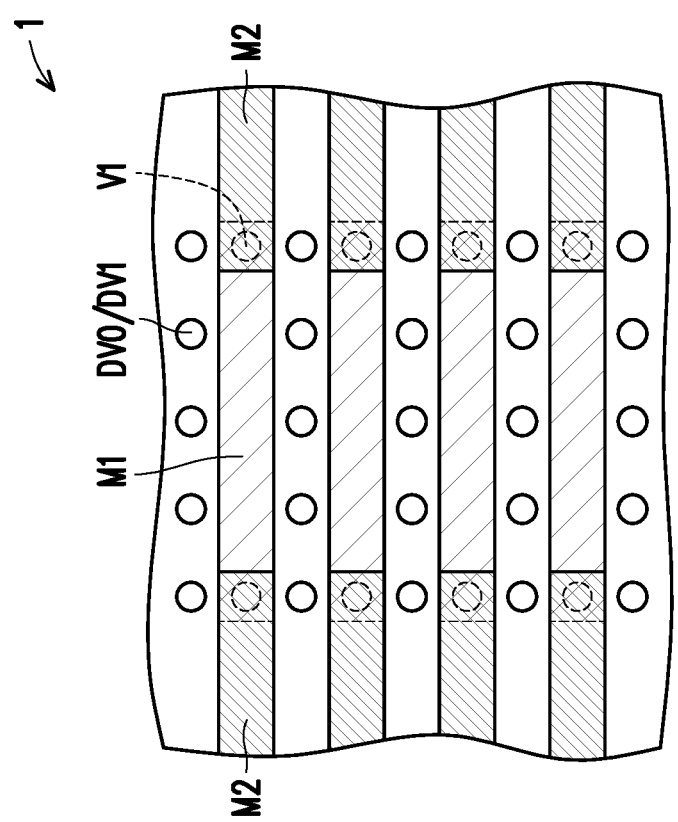
FIG. 2B is a simplified top view of an integrated fan-out package in accordance with some embodiments.

FIG. 1 is a cross-section view of an integrated fan-out package in accordance with some embodiments. FIG. 2A is a simplified three-dimensional illustration of an integrated fan-out package in accordance with some embodiments. FIG. 2B is a simplified top view of an integrated fan-out package in accordance with some embodiments. In FIGS. 2A and 2B, in order to emphasize the main features, some elements are omitted from the figures. In some embodiments, the structure of an integrated fan-out package is illustrated with reference to FIG. 3N in which dummy vias are specifically shown in that cross-section.

In is noted that, the terminology "dummy" herein is for the purpose of describing an element which is electrically isolated from the whole integrated circuit, which includes the dies, the redistribution layers, the UBMs, and bumps. The dummy elements, such as dummy vias, dummy lines and dummy structures are all at a floating potential. In some embodiments, the dummy elements are used to strengthen the rigidity of an integrated fan-out package. In some embodiments, the dummy elements are used to shield an integrated fan-out package from electromagnetic waves.

Referring to FIGS. 1, 2A, and 2B, an integrated fan-out package 1 includes two dies 100 and 200. Each of the dies 100 and 200 may be an application-specific integrated circuit (ASIC) chip, an analog chip, a sensor chip, a wireless and radio frequency chip, a voltage regulator chip or a memory chip, for example. In some embodiments, each of the dies 100 and 200 may include an active component or a passive component. In some embodiments, the die 100 and the die 200 may have same or different functions.

In some embodiments, the die 100 has a substrate 100a, pads 100b over the substrate 100a, a passivation layer 100c over the substrate 100a and exposing portions of the pads 100b, connectors 100d over the passivation layer 100c and electrically connected to the pads 100b, and a protection layer 100e over the passivation layer 100c and aside the connectors 100d. In some embodiments, the side of the die 100 with the connectors 100d is referred to as a front side throughout the description. In some embodiments, a die attach film DAF is provided on the backside of the die 100. In some embodiments, the die 200 has a structure similar to that of the die 100. For example, the die 200 has a substrate 200a, pads 200b, a passivation layer 200c, connectors 200d and a protection layer 200e, but the disclosure is not limited thereto.

In some embodiments, the integrated fan-out package 1 further includes an encapsulant E aside the dies 100 and 200. The encapsulant E surrounds the dies 100 and 200, and exposes the surfaces of the connectors 100d. The encapsulant E includes a molding compound such as epoxy, a photo-sensitive material such as polybenzoxazole (PBO), polyimide (PI) or benzocyclobutene (BCB), a combination thereof or the like.

Figure 3A:
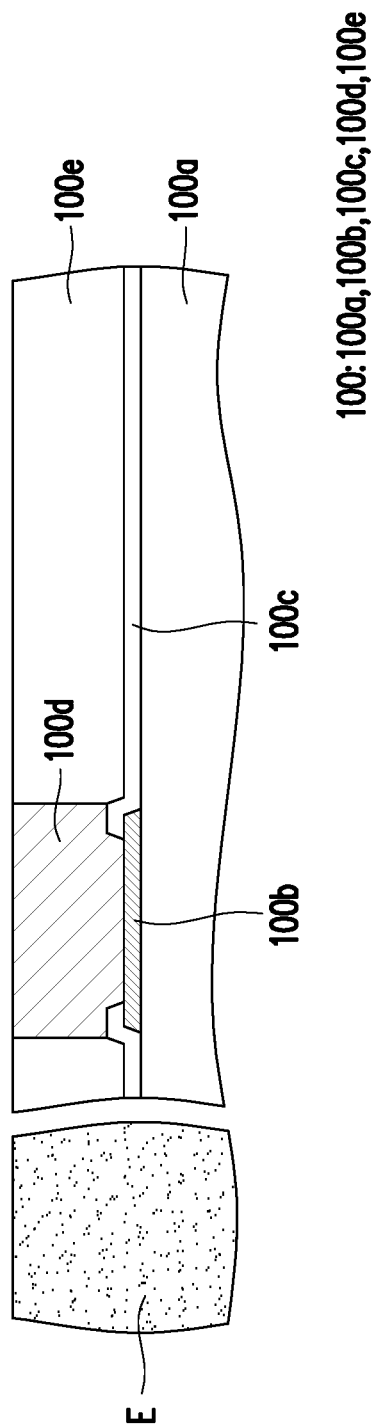
FIGS. 3A to 3N are cross-sectional views of a method of forming dummy vias of an integrated fan-out package in accordance with some embodiments.
Figure 3B:
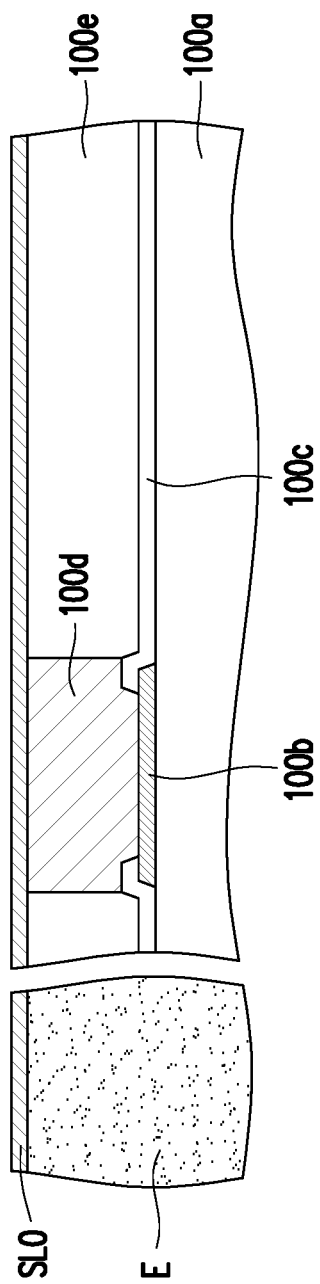
Figure 3C:
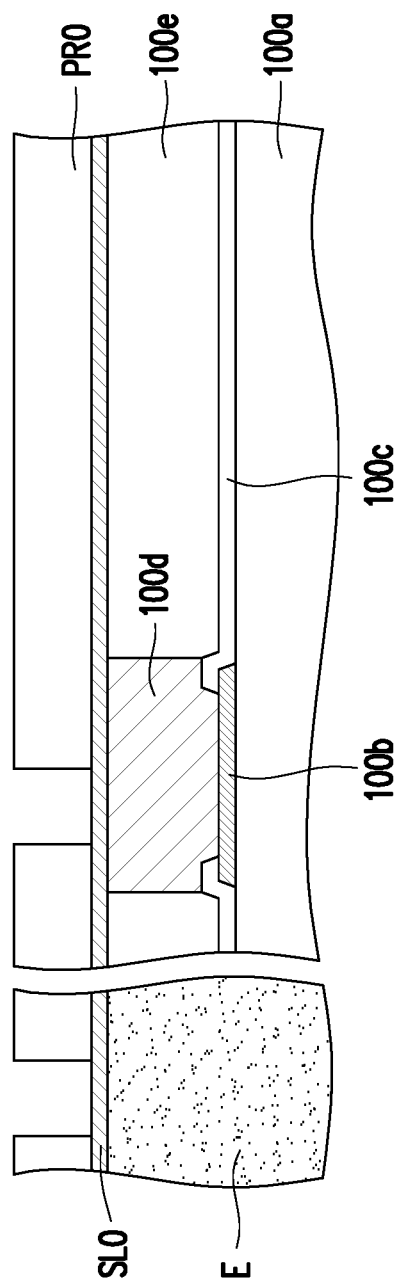
Figure 3D:
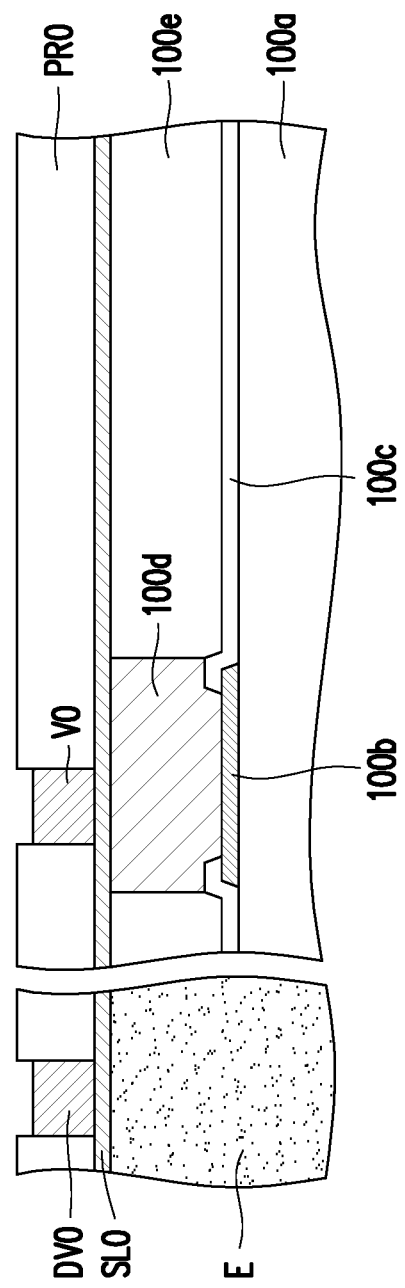
Figure 3E:
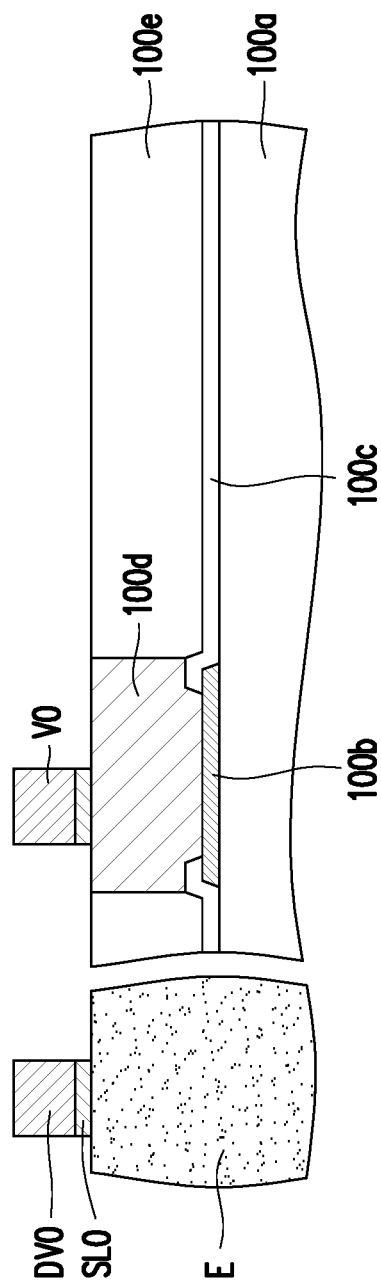
Figure 3F:
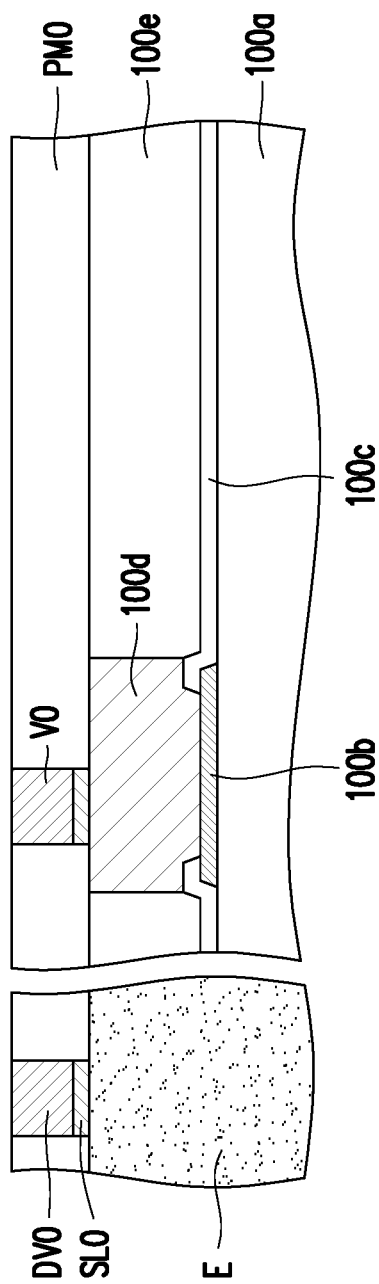
Figure 3G:
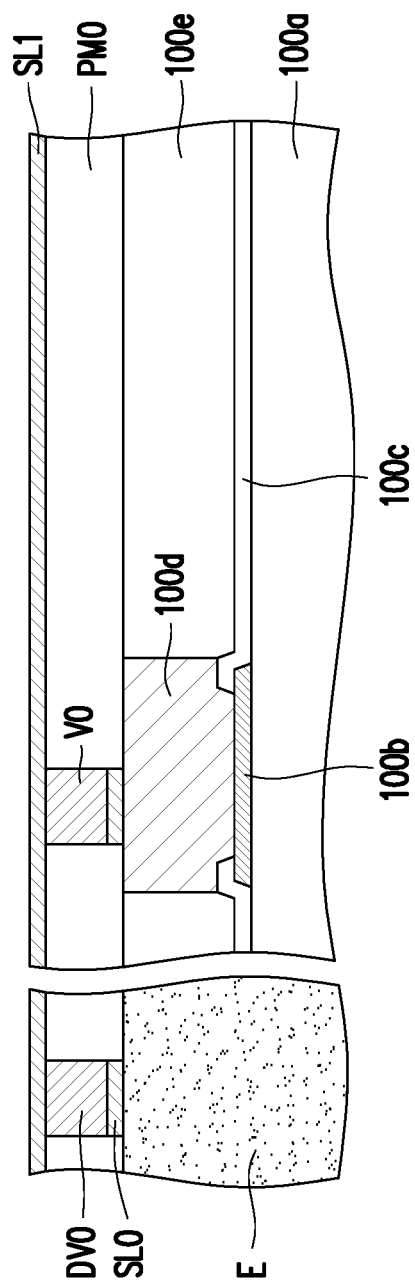
Figure 3H:
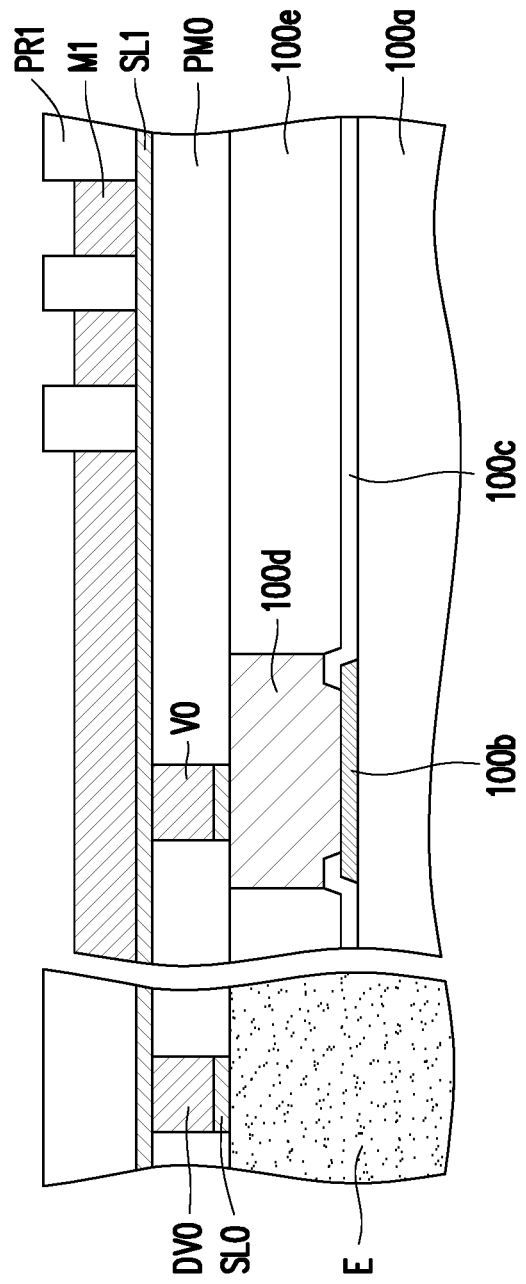
Figure 3I:
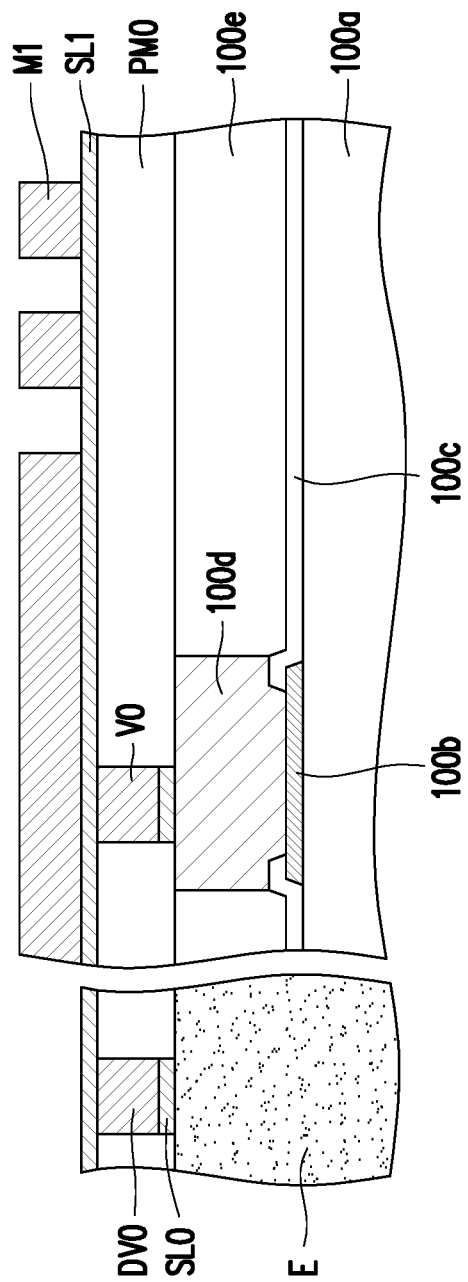
Figure 3J:
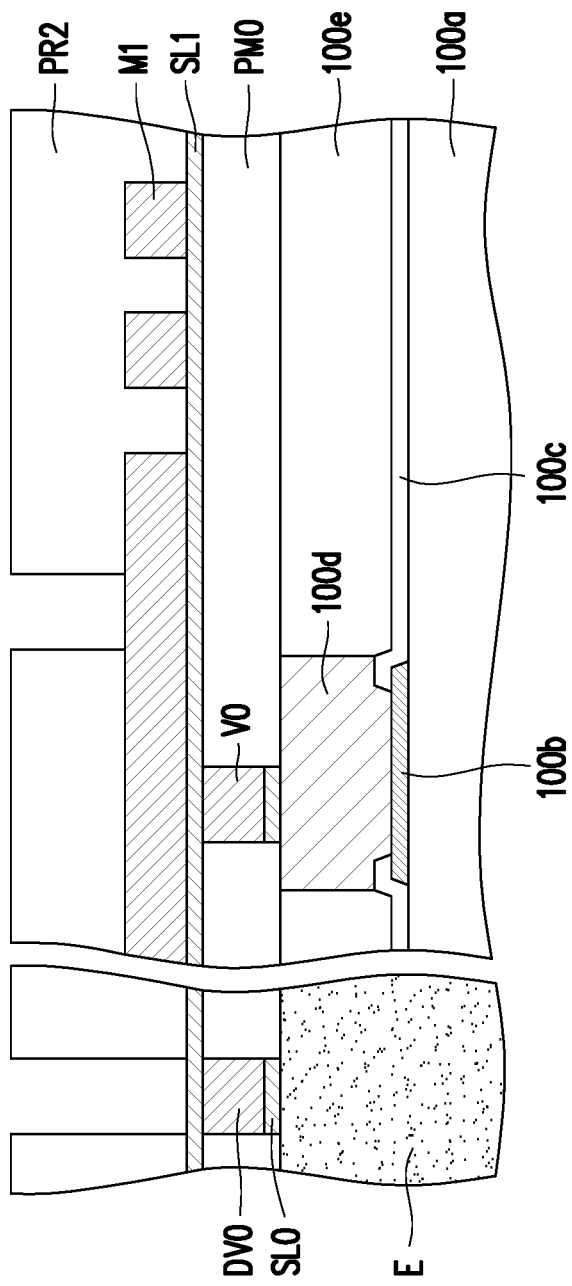
Figure 3K:
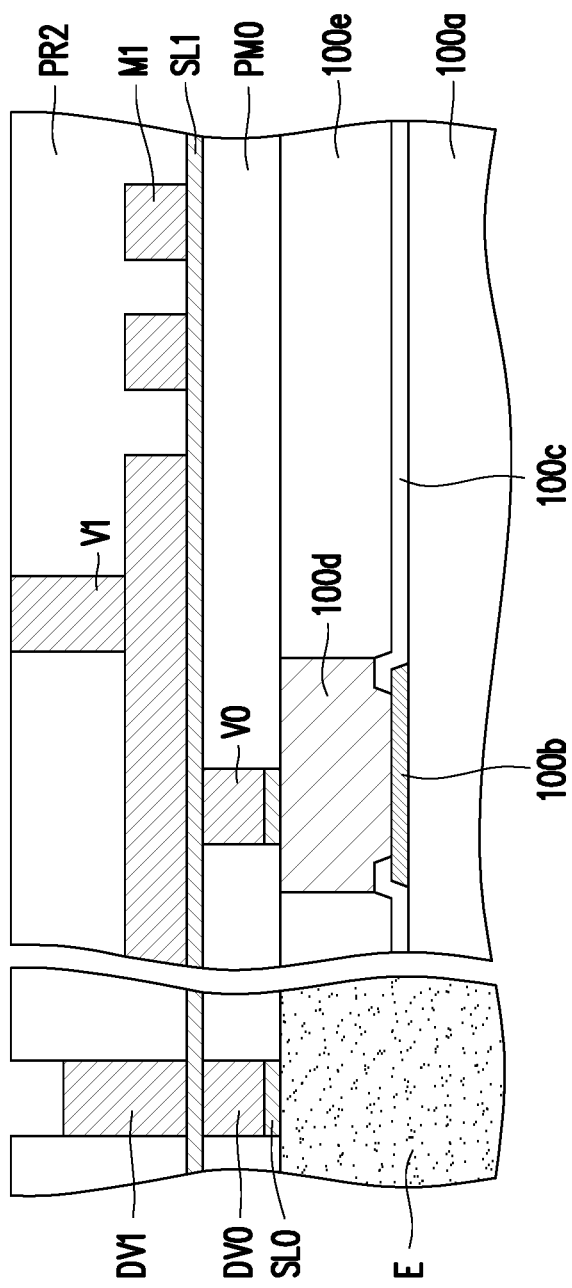
Figure 3L:
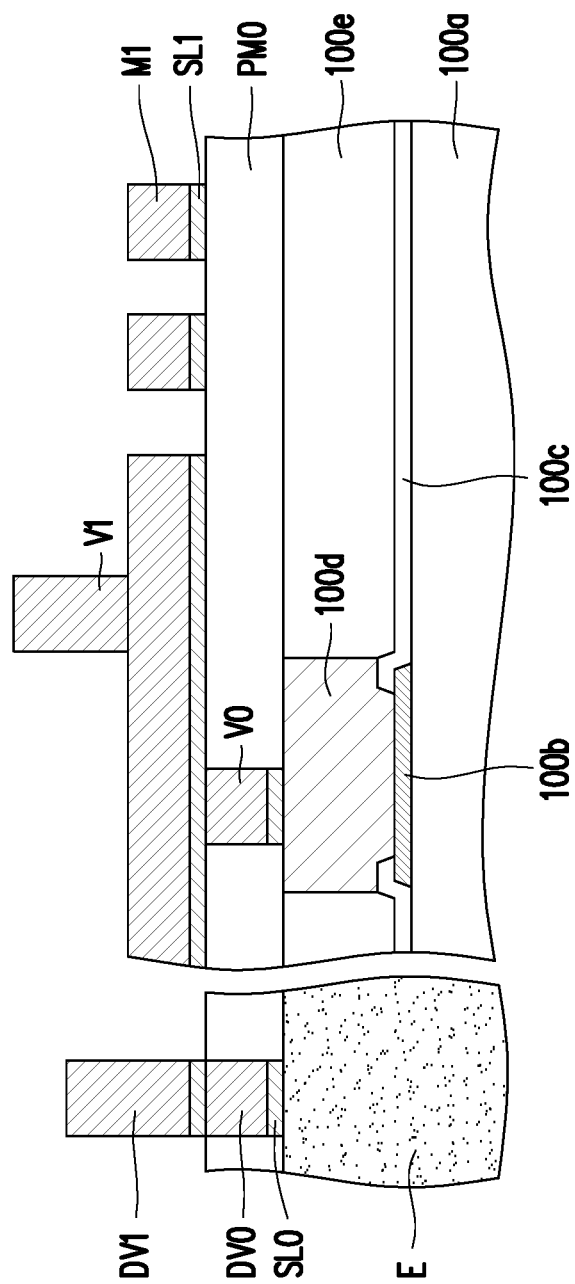
Figure 3M:
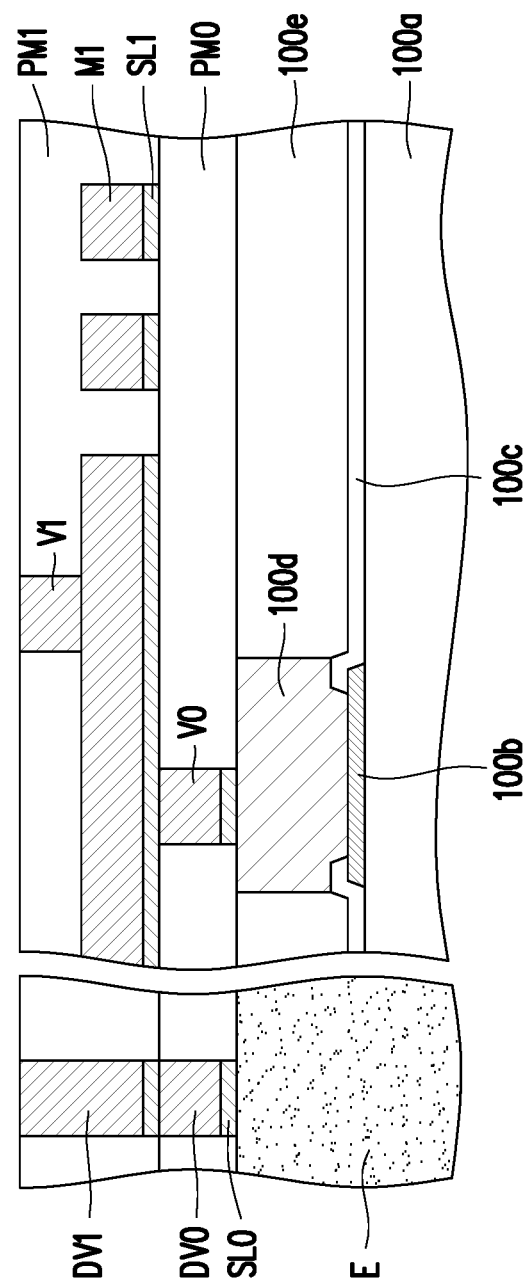
Figure 3N:
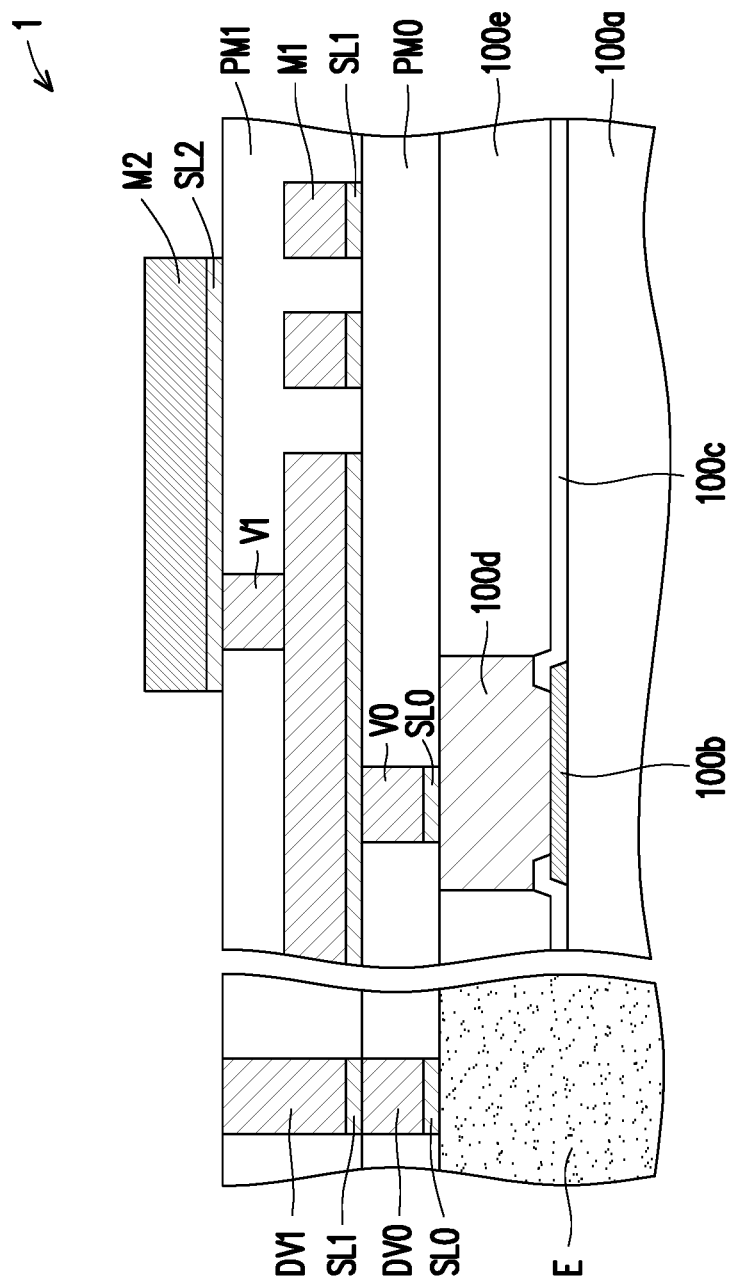

In some embodiments, the vias V0 (as shown in FIGS. 1, 2A and 3N) and dummy vias DV0 (as shown in FIGS. 2A, 2B and 3N) are further included in the integrated fan-out package 1. In some embodiments, the vias V0 and dummy vias DV0 include copper.

The vias V0 are disposed over and electrically connected to the dies 100 and 200. Specifically, the vias V0 are disposed over and electrically connected to the connectors 100d and 200d of the dies 100 and 200.

The dummy vias DV0 are disposed over the encapsulant E between the dies 100 and 200 and electrically isolated from the dies 100 and 200, as shown in FIG. 2 and FIG. 3N. In some embodiments, the dummy vias DV0 further extend over the tops of the dies 100 and 200.

In some embodiments, a seed layer SL0 (as shown in FIGS. 1 and 3N) is disposed between the vias V0 and the connectors 100d or 200d and between the dummy vias DV0 and the encapsulant E. In some embodiments, the seed layer SL0 includes titanium and/or copper.

A polymer layer PM0 (as shown in FIGS. 1 and 3N) is further included to dispose over the dies 100 and 200 and the encapsulant E and surround the vias V0 and dummy vias DV0. In some embodiments, the polymer layer PM0 includes polybenzoxazole (PBO), polyimide (PI), benzocyclobutene (BCB), a combination thereof or the like.

In some embodiments, the integrated fan-out package 1 further includes a metal line M1 (as shown in FIGS. 1 and 3N) over and electrically connected to the dies 100 and 200 through the vias V0. The metal line M1 also connects dies 100 and 200 together. In some embodiments, the metal line M1 is part of a redistribution layer (RDL) structure. In some embodiments, the metal line M1 is called an ultra-high density (UHD) layer. In some embodiments, the metal line M1 includes copper.

In some embodiments, the vias V1 (as shown in FIGS. 1, 2A and 2B) and dummy vias DV1 (as shown in FIGS. 2A, 2B and 3N) are further included in the integrated fan-out package 1. In some embodiments, the vias V1 and dummy vias DV1 include copper.

The vias V1 are disposed over and electrically connected to the metal line M1. Specifically, the vias V1 are in physical contact with the metal line M1 without a seed layer therebetween.

The dummy vias DV1 are disposed over the dummy vias V0. In some embodiments, the dummy vias DV1 are aligned with the dummy vias DV0. In some embodiments, the width of the dummy vias DV1 is substantially the same as the width of the dummy vias DV0, but the present disclosure is not limited thereto. The width of the dummy vias DV1 may be less than or greater than the width of the dummy vias DV0 as needed.

In some embodiments, a seed layer SL1 (as shown in FIGS. 1 and 3N) is disposed between the metal line M1 and the polymer layer PM0 and between dummy vias DV1 and the dummy vias DV0. In some embodiments, the seed layer SL1 includes titanium and/or copper.

A polymer layer PM1 (as shown in FIGS. 1 and 3N) is further included to dispose over the polymer layer PM0 and surround the metal line M1, vias V1 and dummy vias DV1. In some embodiments, the polymer layer PM1 includes polybenzoxazole (PBO), polyimide (PI), benzocyclobutene (BCB), a combination thereof or the like.

In some embodiments, the integrated fan-out package 1 further includes a metal line M2 (as shown in FIG. 1) and a polymer layer PM2 (as shown in FIGS. 1 and 3N) over the polymer layer PM1. The metal line M2 is electrically connected to the metal line M1 through the vias V1. In some embodiments, the metal line M2 is part of a redistribution layer (RDL) structure. In some embodiments, the metal line M2 is called an ultra-high density (UHD) layer. In some embodiments, the metal line M2 includes copper. In some embodiments, the polymer layer PM2 includes polybenzoxazole (PBO), polyimide (PI), benzocyclobutene (BCB), a combination thereof or the like. In some embodiments, the polymer layer PM2 exposes part of the metal line M2.

In some embodiments, a seed layer SL2 (as shown in FIGS. 1 and 3N) is disposed between the metal line M2 and the polymer layer PM1. In some embodiments, the seed layer SL2 includes titanium and/or copper.

In some embodiments, the integrated fan-out package 1 further includes a metal line M3 (as shown in FIG. 1) and a polymer layer PM3 (as shown in FIG. 1) over the polymer layer PM2. The metal line M3 is electrically connected to the metal line M2 through the vias V2. In some embodiments, the metal line M3 is part of a redistribution layer (RDL) structure. In some embodiments, the metal line M3 includes copper. In some embodiments, the polymer layer PM3 includes polybenzoxazole (PBO), polyimide (PI), benzocyclobutene (BCB), a combination thereof or the like. In some embodiments, the polymer layer PM2 exposes part of the metal line M2.

In some embodiments, a seed layer SL3 (as shown in FIG. 1) is disposed between the metal line M3 and the polymer layer PM2, between the vias V2 and the polymer layer PM2, and between the vias V2 and the metal line M2. In some embodiments, the seed layer SL3 includes titanium and/or copper.

In some embodiments, the integrated fan-out package 1 further includes under bump metallization pads UBM (as shown in FIG. 1) over and electrically connected to the metal line M3. Thereafter, bumps (not shown) are on the under bump metallization pads UBM respectively. In some embodiments, the bumps include copper, solder, nickel or a combination thereof.

In some embodiments, a seed layer SL4 (as shown in FIG. 1) is disposed between the under bump metallization pads UBM and the polymer layer PM3 and between the under bump metallization pads UBM and the metal line M3. In some embodiments, the seed layer SL4 includes titanium and/or copper.

In some embodiments, the size of the vias V1 is smaller than the size of the vias V2. In some embodiments, the diameter of the vias V1 is ten times smaller than the diameter of the vias V2. In some embodiments, the vias V1 are defined by photolithography, plating, and photoresist stripping processes, and the vias V2 are defined by a damascene process.

Referring to FIG. 2A, two dies 100 and 200 are arranged next to each other. An encapsulant E is between the two dies 100 and 200. A metal line M1 is over the two dies 100 and 200 and the encapsulant E, and is electrically connected to the two dies 100 and 200 through the vias V0. Multiple dummy vias DV0 and DV1 are disposed over the encapsulant E and aside the metal line M1. The dummy vias DV0 are formed over and in physical contact with the encapsulant E. The dummy vias DV1 are formed over the dummy vias DV0. The dummy vias DV0 and the dummy vias DV1 are collectively called as dummy vias DV. A metal line M2 is electrically connected to the metal line M1 through the vias V1.

When the dimension of the metal line M1 becomes smaller to accommodate more devices, the line width of the metal line M1 also becomes smaller, and therefore, the part of the metal line M1 which connects the two dies 100 and 200 and traverses across the encapsulant E between the dies 100 and 200 may become fragile mechanically. In the present disclosure, multiple dummy vias DV are formed to enhance the mechanical strength of the metal line M1 against the subsequent process such as a CMP process.

Specifically, the dummy vias DV are arranged aside the metal line M1 to enhance the rigidity of the metal line M1 on the die-to-die region. The dummy vias DV prevent the metal line M1 from breaking due to stress between the two dies 100 and 200.

In some embodiments, the dummy vias DV are electrically isolated from the metal line M1. Therefore, the dummy vias DV will not affect the electric properties of the integrated fan-out package.

In some embodiments, the dummy vias DV further extends over at least one of the two dies 100 and 200 to provide further protections to the metal line M1. In some embodiments, such as shown in FIG. 2A, the dummy vias DV extends over the two dies 100 and 200.

Referring to FIG. 2B, which is a simplified top view of the structure of integrated fan-out packages in accordance with some embodiments. The metal line M1 is electrically connected to the metal line M2 through the vias V1. The dummy vias DV0 and DV1 are aside the metal lines M1 and M2. The dummy vias DV0 and DV1 are aside and electrically isolated from the metal lines M1 and M2.

In some embodiments, the dummy vias DV0 and DV1 are disposed symmetrically respect to the metal lines M1 and M2. In some embodiments, the dummy vias DV0 and DV1 are spaced equally. However, the disclosure is not limited thereto. For example, the dummy vias DV0 and DV1 may be disposed randomly aside the metal lines M1 and M2. The dummy vias DV0 and DV1 may be distributed regularly or irregularly in the sparse area upon the process requirements.

In some embodiments, the dummy vias DV0 and DV1 are cylindrical pillars. However, the disclosure is not limited thereto. The dummy vias DV0 and DV1 may be square pillars, polygonal pillars, parallel walls or any supports with suitable shapes upon the process requirements.

With the dummy vias DV0 and DV1 disposed aside the ultra-high density (UHD) layer, such as the metal line M1 which are used to connecting the dies 100 and 200, the rigidity of the metal line M1 against the subsequent CMP process is enhanced.

FIGS. 3A to 3N are cross-sectional views of a method of forming dummy vias of an integrated fan-out package in accordance with some embodiments. For illustration purposes, different local cross-sections of an integrated fan-out package are shown. Specifically, in FIGS. 3A to 3N, dummy vias are illustrated in one cross-section while metal lines are illustrated in another cross-section. Herein, the method of forming the dummy vias DV0 and DV1 of the integrated fan-out package 1 shown in FIGS. 2A and 2B are locally illustrated in FIGS. 3A to 3N.

Referring to FIG. 3A, at least one die 100 is placed on a carrier (not shown). The die 100 has a substrate 100a, pads 100b over the substrate 100a, a passivation layer 100c over the substrate 100a and exposing portions of the pads 100b, connectors 100d over the passivation layer 100c and electrically connected to the pads 100b, and a protection layer 100e over the passivation layer 100c and aside the connectors 100d.

An encapsulant E is formed aside the die 100. In some embodiments, the encapsulant E surrounds the die 100 and exposes the surfaces of the connectors 100d. The encapsulant E includes a molding compound such as epoxy, a photo-sensitive material such as polybenzoxazole (PBO), polyimide (PI) or benzocyclobutene (BCB), a combination thereof or the like. The method of forming the encapsulant E includes forming an encapsulant material layer on the carrier (not shown) covering the die 100 and performing a grinding process to partially remove the encapsulant material layer.

Referring to FIG. 3B, a seed layer SL0 is formed over the connectors 100d, the protection layer 100e and the encapsulant E. In some embodiments, the seed layer SL0 includes metal such as titanium and/or copper, and can be formed by a sputtering or a suitable method.

Referring to FIG. 3C, a photoresist layer PR0 is formed on the seed layer SL0. In some embodiments, the photoresist layer PR0 is a dry film resist (DFR) and has openings that expose the intended locations for the subsequently formed vias V0 over the die 100 and dummy vias DV0 over the encapsulant E. The openings for the vias V0 are over the connectors 100d of the die 100, and the openings for the dummy vias DV0 are over the encapsulant E.

Referring to FIG. 3D, the vias V0 and the dummy vias DV0 are formed in the openings of the photoresist layer PR0 over the die 100 and the encapsulant E respectively. In some embodiments, the method of forming the vias V0 and the dummy vias DV0 includes performing an electrochemical plating (ECP) process. In some embodiments, the vias V0 and the dummy vias DV0 are plated in the openings of the photoresist layer PR0 by using the seed layer SL0 as a seed. In some embodiments, the vias V0 and the dummy vias DV0 include copper.

Referring to FIG. 3E, the photoresist layer PR0 and the underlying seed layer SL0 are removed. Therefore, the remaining seed layer SL0 is between the vias V0 and the connectors 100d and between the dummy vias DV0 and the encapsulant E.

Referring to FIG. 3F, a polymer layer PM0 is formed over the connectors 100d, the protection layer 100e and the encapsulant E. The top surface of the polymer layer PM0 is substantially coplanar with top surfaces of the vias V0 and dummy vias DV0. In some embodiments, the polymer layer PM0 includes polybenzoxazole (PBO), polyimide (PI), benzocyclobutene (BCB), a combination thereof or the like.

Referring to FIG. 3G, a seed layer SL1 is formed on the entire surface of the polymer layer PM0 and in physical contact with the top surfaces of the vias V0 and the dummy vias DV0. In some embodiments, the seed layer SL1 includes titanium and/or copper, and is formed by a sputtering or a suitable method.

Referring to FIG. 3H, a photoresist layer PR1 is formed on the seed layer SL1. In some embodiments, the photoresist layer PR1 is a dry film resist (DFR) and has openings that expose the intended locations for a subsequently formed metal line M1. Afterwards, an electroplating process is performed to form the metal line M1 (e.g., a copper layer) in the openings of the photoresist layer PR1 by using the seed layer SL1 as a seed. In some embodiments, the metal line M1 is part of the redistribution layer.

Referring to FIG. 3I, the photoresist layer PR1 is removed. The photoresist layer PR1 is removed without removing the underlying seed layer SL1.

Referring to FIG. 3J, a photoresist layer PR2 is formed on the seed layer SL1 and the metal line M1. In some embodiments, the photoresist layer PR2 is a dry film resist (DFR) and has openings that expose the intended locations for the subsequently formed vias V1 and dummy vias DV1.

Referring to FIG. 3K, vias V1 and dummy vias DV1 are formed in the openings of the photoresist layer PR2. The vias V1 and dummy vias DV1 include copper. In some embodiments, an electroplating process is performed to form vias V1 by using the metal line M1 as a seed and form dummy vias DV1 by using the seed layer SL1 as a seed. The vias V1 are formed directly on the metal line M1 without a seed layer therebetween, and the dummy vias DV1 is formed over the dummy vias DV0 with the seed layer SL1 therebetween.

Referring to FIG. 3L, the photoresist layer PR2 and the underlying seed layer SL1 are removed. Therefore, the remaining seed layer SL1 is between the metal line M1 and the polymer layer PM0 and between the dummy vias DV1 and the dummy vias DV0.

Referring to FIG. 3M, a polymer layer PM1 is formed over the polymer layer PM0, covering the metal line M1. In some embodiments, the top surface of the polymer layer PM1 is substantially coplanar with the top surfaces of the vias V1 and the dummy vias DV1. In some embodiments, the polymer layer PM1 includes polybenzoxazole (PBO), polyimide (PI), benzocyclobutene (BCB), a combination thereof or the like.

The method of forming the polymer layer PM1 includes the following operations. A polymer layer PM1 is first formed over the polymer PM0, covering the metal line M1, the vias V1 and the dummy vias DV1. Thereafter, a planarization process is performed to remove the excess parts of the polymer layer PM1, the vias V1 and the dummy vias DV1. In some embodiments, the planarization process is performed to the polymer layer PM1 until the top surfaces of the vias V1 and dummy vias DV1 are exposed. In some embodiments, the planarization process includes a chemical mechanical planarization (CMP) process. However, the disclosure is not limited thereto.

Referring to FIG. 3N, a seed layer SL2 is formed over the polymer layer PM1. A metal line M2 is plated over the polymer layer PM1 by using the seed layer SL2 as a seed. The metal line M2 is part of a redistribution layer. The metal line M2 is electrically connected to the metal line M1 through the vias V1. The dummy vias DV0 and DV1 of the present disclosure is thus completed for enhancing the rigidity of the metal line M1.

Except for enhancing the rigidity of the metal line M1, the dummy vias DV0 and DV1 also provide additional advantages. The dummy vias DV1 may provide a more precise endpoint detection of chemical mechanical planarization on planarizing the polymer layer PM1.

When performing the planarization process, an electrical endpoint detection method may be applied to determine the thickness of the vias. When the planarization process touches the top surfaces of vias, a current density may change significantly. With extra dummy vias disposed around the metal line, which are equivalent to extra metal surfaces, the current density may be larger than the current density when there is no dummy via. Therefore, a more precise endpoint may be provided to the chemical mechanical planarization process. With the disposition of the dummy vias of the disclosure, the flatness during the planarization process is accordingly improved.

Figure 4:
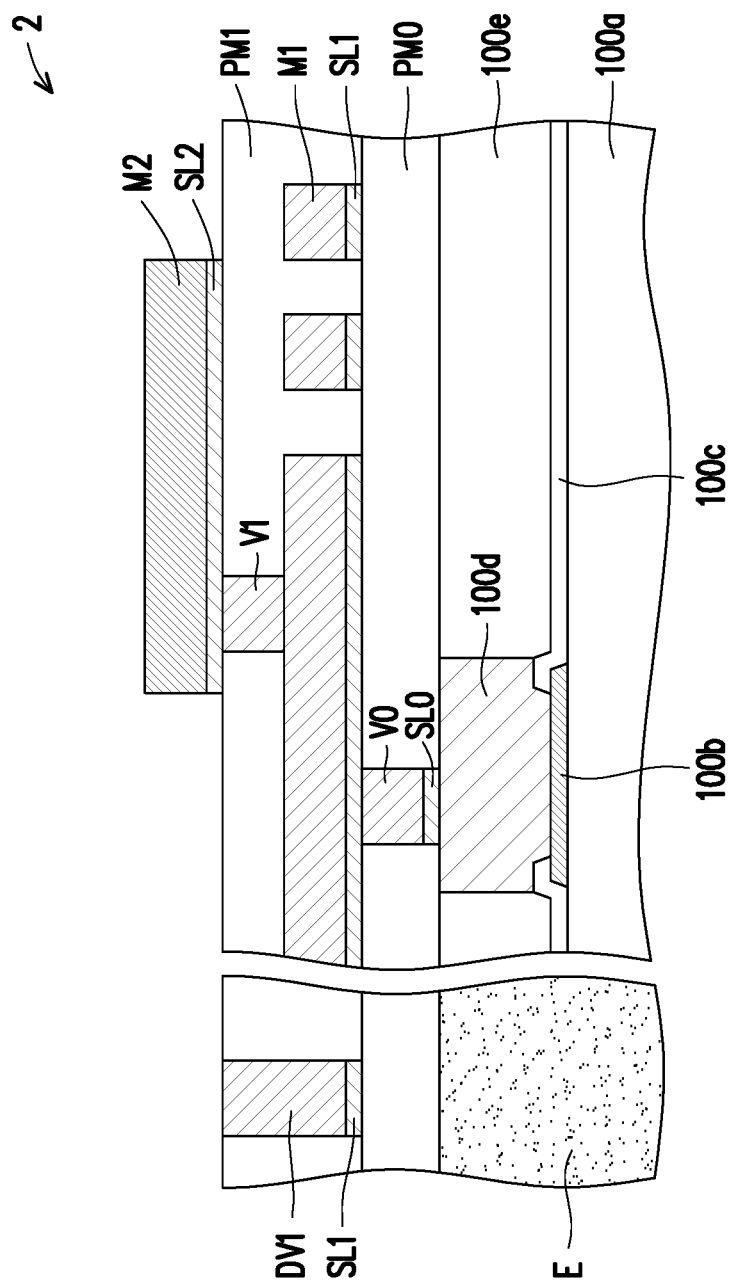
FIG. 4 is a cross-sectional view of an integrated fan-out package in accordance with some embodiments.

In some embodiments, the operation of forming dummy vias DV0 may be removed from the method described above, and thus, an integrated fan-out package 2 of FIG. 4 is formed. In the integrated fan-out package 2, the dummy vias DV1 are not in physical contact with the encapsulant E.

The embodiments in which the dummy vias are provided for strength the rigidity of the integrated fan-out package are illustrated for illustration purposes, and are not construed as limiting the present disclosure. In some embodiments, the dummy vias can be configured to shield the environmental electromagnetic waves.

Figure 5:
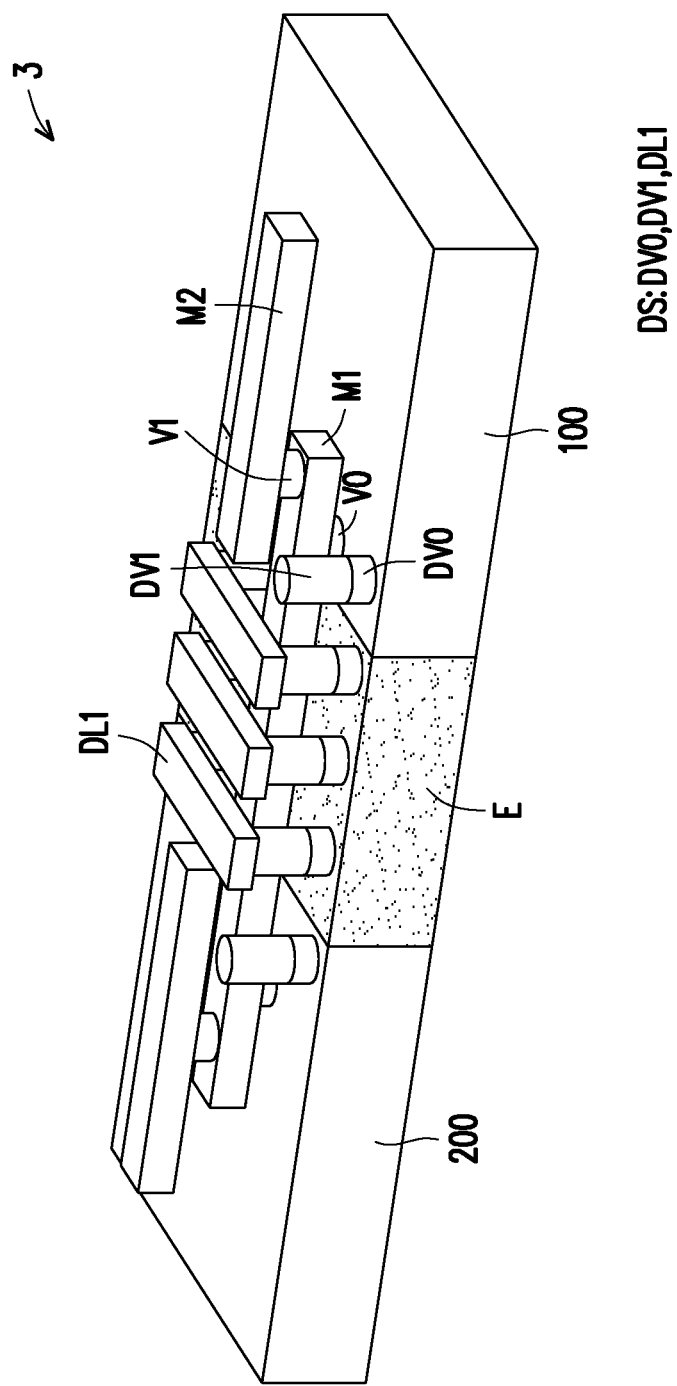
FIG. 5 is a simplified three-dimensional illustration of the structure of integrated fan-out packages in accordance with some embodiments.
Figure 6:
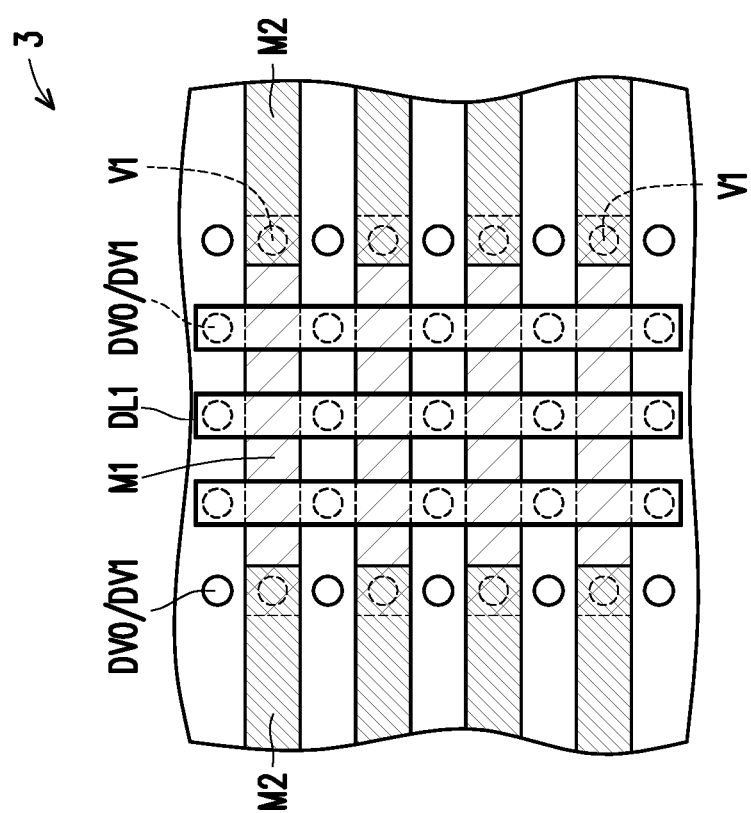
FIG. 6 is a simplified top view of an integrated fan-out package in accordance with some embodiments.
Figure 7:
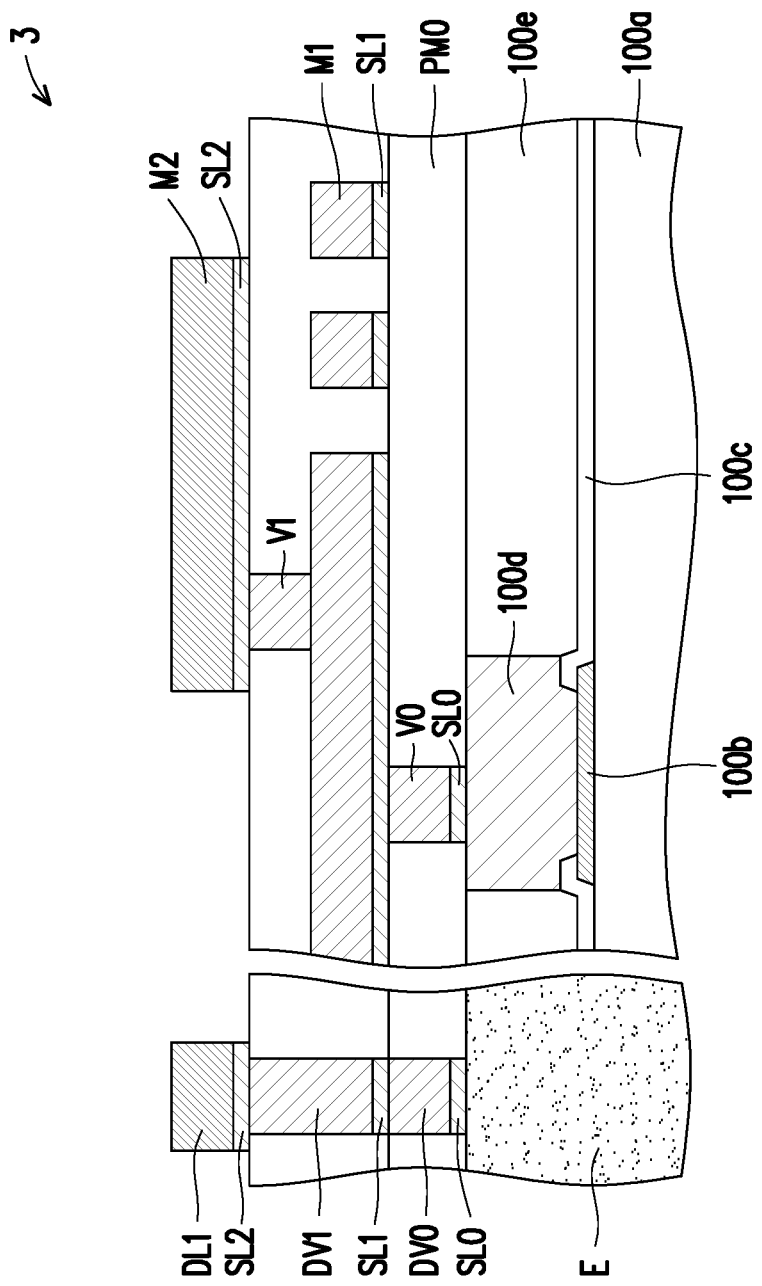
FIG. 7 is a cross-sectional view of an integrated fan-out package in accordance with some embodiments.
Figure 8:
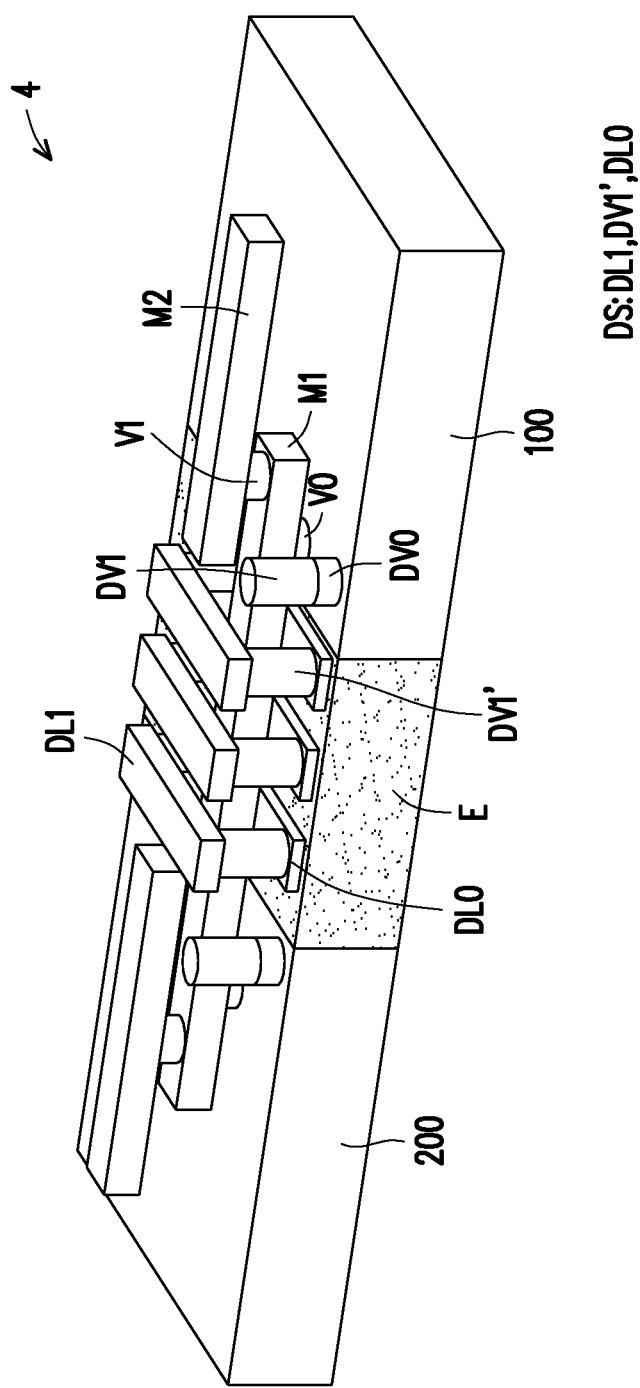
FIG. 8 is a simplified three-dimensional illustration of an integrated fan-out package in accordance with some embodiments.

FIG. 5 is a cross-sectional view of a method of forming an integrated fan-out package in accordance with some embodiments. FIG. 6 is a simplified top view of the structure of integrated fan-out packages in accordance with some embodiments. FIG. 7 is a cross-sectional view of an integrated fan-out package in accordance with some embodiments. FIG. 8 is a simplified three-dimensional illustration of an integrated fan-out package in accordance with some embodiments.

FIG. 5 is similar to FIG. 2A, and the difference between them is the formation of dummy lines DL1 in FIG. 5. FIG. 6 is similar to FIG. 2B, and the difference between them is the formation of dummy lines DL1 in FIG. 6. FIG. 7 is similar to FIG. 3N, and the difference between them is the formation of dummy lines DL1 in FIG. 7. FIG. 8 is similar to FIG. 2A, and the difference between them is the formation of dummy lines DL0 and DL1 in FIG. 8. Like reference characters will be used to represent like elements. The difference between them will be described in details below, and the similarity is not iterated herein.

Referring to FIG. 5 to FIG. 8, the integrated fan-out package 3/4 includes two dies 100 and 200 disposed side by side, an encapsulant E disposed around the two dies 100 and 200, a metal line M1 disposed over the two dies 100 and 200 and the encapsulant E and electrically connected to the two dies 100 and 200, and a dummy structure DS surrounding and electrically isolated from the metal line M1. In some embodiments, the dummy structure DS is in physical contact with the encapsulant E between the two dies 100 and 200.

In some embodiments, the dummy structure DS partially surrounds the metal line M1, as shown in FIG. 5. For example, as shown in FIGS. 5-7, the dummy structure DS includes dummy vias DV0 and DV1 disposed aside the metal line M1 and dummy lines DL1 disposed over the dummy vias DV1 and substantially parallel to each other. The dummy lines DL1 are formed during the forming of the metal line M2. The dummy lines DL1 are substantially at the same level as the metal line M2. The dummy lines DL1 extend in a direction different from (e.g., perpendicular to) that of metal line M2. A seed layer SL2 is formed between the dummy lines DL1 and the dummy vias DV1 and between the metal line M2 and the polymer layer PM1. In some embodiments, each of the dummy lines DL1 connects two dummy vias DV1 at opposite sides of the metal line M1. Specifically, the dummy structure DS includes multiple arch-like portions across the metal line M1.

The dummy structure DS which includes the dummy lines DL1 and the dummy vias DV0/DV1 can provide better shielding to the metal line M1. The electromagnetic waves from all directions of the environment may interfere the electric signal transmitted within the integrated fan-out package. In the prior arts, the typical solution is to have a metal shielding layer over the redistribution layer. The disadvantage of this shielding layer is that the shielding layer can only shield the electromagnetic waves from one direction, which is from the top of the redistribution layer. As shown in FIGS. 5, 6, and 7, the dummy structure DS of the disclosure can shield the electromagnetic waves coming from the sides and the top of the metal line M1, which provides better electromagnetic wave shielding than a typical shielding layer.

In some embodiments, the dummy structure DS completely surrounds the metal line M1, as shown in FIG. 8. For example, as shown in FIG. 8, the dummy structure DS includes dummy vias DV1' disposed aside the metal line M1, dummy lines DL1 disposed over the dummy vias DV1' and substantially parallel to each other, and dummy lines DL0 disposed below the dummy vias DV1' and substantially parallel to each other. The dummy lines DL1 are formed during the forming of the metal line M2. The dummy vias DV1' over the encapsulant E are formed during the formation of the dummy vias DV1 over the dies 100 and 200. The height of the dummy vias DV1' is greater than the height of the dummy vias DV1. The dummy lines DL0 are formed before or after the formation of the dummy vias DV0. The height of the dummy lines DL0 is less than the height of the dummy vias DV0. The dummy lines DL1 are substantially parallel to the dummy lines DL0. In some embodiments, each of the dummy lines DL1 connects two dummy vias DV1' at opposite sides of the metal line M1. Similarly, each of the dummy lines DL0 connects two dummy vias DV1' at opposite sides of the metal line M1. Specifically, the dummy structure DS includes multiple ring-like portions surrounding the metal line M1. Since the dummy structure DS surrounds the metal line M1, the dummy structure DS can shield the environmental electromagnetic waves from the sides, the top and the bottom of the metal line M1.

The above embodiments in which the dummy structure is formed to around the metal line M1 are provided for illustration purposes, and are not construed as limiting the present disclosure. In some embodiments, the dummy structure may be formed around the metal line M2, and such dummy structure may be not in physical contact with the encapsulant E. The structure and disposition of the dummy structure is not limited by the disclosure.

In accordance with some embodiments of the present disclosure, an integrated fan-out package includes two dies, an encapsulant, a first metal line and a plurality of dummy vias. The encapsulant is disposed between the two dies. The first metal line is disposed over the two dies and the encapsulant, and is electrically connected to the two dies. The plurality of dummy vias is disposed over the encapsulant and aside the first metal line.

In accordance with alternative embodiments of the present disclosure, an integrated fan-out package includes two dies, an encapsulant, a first metal line, and a dummy structure. The two dies are disposed side by side. The encapsulant is disposed around the two dies. The first metal line is disposed over the two dies and the encapsulant, and electrically connected to the two dies. The dummy structure is surrounding and electrically isolated from the first metal line.

In accordance with yet alternative embodiments of the present disclosure, a method of forming an integrated fan-out package includes the following operations. A seed layer is formed over two dies and over an encapsulant between the two dies. A first photoresist layer is formed on the seed layer. A first metal line is formed by using the seed layer as a seed. The first photoresist layer is removed. A second photoresist layer is formed on the seed layer. A plurality of first vias is formed over the two dies by using the first metal line as a seed and forming a first plurality of dummy vias over the encapsulant by using the seed layer as a seed. The second photoresist layer is removed.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package, comprising:
   two dies, laterally disposed side by side;
   an encapsulant, disposed between the two dies;
   a first metal line, disposed over the two dies and the encapsulant, overlapped with the two dies from a top view, and electrically connected to the two dies; and
   a plurality of dummy vias, disposed over the encapsulant between the two dies and aside the first metal line.

2. The integrated fan-out package of claim 1, wherein the plurality of dummy vias is in physical contact with the encapsulant.

3. The integrated fan-out package of claim 1, wherein the plurality of dummy vias is not in physical contact with the encapsulant.

4. The integrated fan-out package of claim 1, wherein the plurality of dummy vias is electrically isolated from the first metal line.

5. The integrated fan-out package of claim 1, wherein the plurality of dummy vias further extends over at least one of the two dies.

6. The integrated fan-out package of claim 1, wherein the plurality of dummy vias is disposed symmetrically with respect to the first metal line.

7. The integrated fan-out package of claim 1, wherein the plurality of dummy vias is spaced equally with respect to the first metal line.

8. The integrated fan-out package of claim 1, further comprising:
   a plurality of first vias, over and electrically connected to the first metal line; and
   a second metal line, over and electrically connected to the plurality of first vias.

9. The integrated fan-out package of claim 8, wherein top surfaces of the plurality of dummy vias are coplanar with top surfaces of the plurality of first vias.

10. The integrated fan-out package of claim 1, wherein bottoms of dummy vias are lower than a bottom of the first metal line.

11. The integrated fan-out package of claim 1, wherein bottoms of dummy vias are as high as a bottom of the first metal line.

12. An integrated fan-out package, comprising:
    two dies laterally disposed side by side;
    an encapsulant, disposed around the two dies;
    a first metal line, disposed over the two dies and the encapsulant, overlapped with the two dies from a top view, and electrically connected to the two dies; and
    a dummy structure, surrounding and electrically isolated from the first metal line,
    wherein the dummy structure comprises:

a plurality of dummy vias, disposed aside the first metal line; and a plurality of first dummy lines, disposed over the plurality of dummy vias and parallel to each other.

13. The integrated fan-out package of claim 12, wherein the dummy structure is in physical contact with the encapsulant between the two dies.

14. The integrated fan-out package of claim 12, wherein the dummy structure partially surrounds the first metal line.

15. The integrated fan-out package of claim 12, wherein the dummy structure completely surrounds the first metal line.

16. The integrated fan-out package of claim 12, wherein the dummy structure further comprises:

a plurality of second dummy lines, disposed below plurality of dummy vias and parallel to each other.

17. An integrated fan-out package, comprising:

two dies, laterally disposed side by side;

an encapsulant, disposed between the two dies;

a first metal line, disposed over the two dies and the encapsulant and electrically connected to the two dies;

a first plurality of dummy vias, disposed over the encapsulant and aside the first metal line, wherein the first plurality of dummy vias is in physical contact with the encapsulant; and a second plurality of dummy vias, disposed over the encapsulant and aside the first metal line, wherein the second plurality of dummy vias is in physical contact with at least one of the two dies.

18. The integrated fan-out package of claim 17, wherein the first plurality of dummy vias is electrically isolated from the first metal line.

19. The integrated fan-out package of claim 17, wherein the first plurality of dummy vias is spaced equally with respect to the first metal line.

20. The integrated fan-out package of claim 17, wherein the first metal line is physically separated from the encapsulant.

* * * * *